United States Patent
Roy

(10) Patent No.: US 8,937,341 B2
(45) Date of Patent: Jan. 20, 2015

(54) TWO-PHASE CHARGE-COUPLED DEVICE

(75) Inventor: François Roy, Seyssins (FR)

(73) Assignee: STMicrelectronics (Crolles 2) SAS, Crolles (FR)

( * ) Notice: Subject to any disclaimer, the term of this patent is extended or adjusted under 35 U.S.C. 154(b) by 1039 days.

(21) Appl. No.: 12/821,807

(22) Filed: Jun. 23, 2010

(65) Prior Publication Data

US 2010/0327326 A1     Dec. 30, 2010

(30) Foreign Application Priority Data

Jun. 24, 2009    (FR) ...................................... 09 54295

(51) Int. Cl.
*H01L 29/80*      (2006.01)
*H01L 29/768*     (2006.01)
*H01L 27/148*     (2006.01)

(52) U.S. Cl.
CPC .... *H01L 29/76808* (2013.01); *H01L 27/14812* (2013.01); *H01L 29/76841* (2013.01)
USPC ............ 257/215; 257/244; 257/246; 257/248

(58) Field of Classification Search
CPC ................... H01L 27/14806; H01L 27/10864; H01L 27/14831; H01L 29/1062
USPC ........................... 257/215, 242–244, 246, 248
See application file for complete search history.

(56) References Cited

U.S. PATENT DOCUMENTS

| 4,926,225 A * | 5/1990 | Hosack .......................... 257/225 |
| 5,029,321 A | 7/1991 | Kimura |
| 5,055,900 A | 10/1991 | Fossum et al. |

FOREIGN PATENT DOCUMENTS

| EP | 0 418 500 A2 | 3/1991 |
| JP | 56013769 A | 2/1981 |
| JP | 04045548 A | 2/1992 |

OTHER PUBLICATIONS

French Search Report dated Jan. 15, 2010 from corresponding French Application No. 09/54295.
French Search Report dated Jan. 15, 2010 from related French Application No. 09/54296.
French Search Report dated Jan. 15, 2010 from related French Application No. 09/54294.

* cited by examiner

*Primary Examiner* — Jack Chen
(74) *Attorney, Agent, or Firm* — Seed IP Law Group PLLC

(57) ABSTRACT

A charge-coupled unit formed in a semiconductor substrate and including an array of identical electrodes forming rows and columns, wherein: each electrode extends in a cavity with insulated walls formed of a groove, oriented along a row, dug into the substrate thickness, and including, at one of its ends, a protrusion extending towards at least one adjacent row.

17 Claims, 5 Drawing Sheets

TWO-PHASE CHARGE-COUPLED DEVICE

CROSS REFERENCE TO RELATED APPLICATIONS

This application claims the priority benefit of French patent application Ser. No. 09/54295, filed on Jun. 24, 2009, entitled "TWO-PHASE CHARGE-COUPLED DEVICE," which is hereby incorporated by reference to the maximum extent allowable by law.

BACKGROUND OF THE INVENTION

1. Field of the Invention

The present invention relates to charge-coupled devices or CCDs. It more specifically aims at a two-phase CCD array device. A preferred application to a CCD image sensor will be described hereafter, it being understood that the present invention may apply to any type of CCD.

2. Discussion of the Related Art

The charge transfer in a CCD is often carried out in four phases, that is, the shifting of a charge packet from one pixel to an adjacent pixel takes four steps corresponding to four periods of a clock driving the transfer.

FIGS. 1A to 1C schematically show a portion of a four-phase charge-coupled image sensor. FIG. 1A is a top view, FIG. 1B is a cross-section view along plane B-B of FIG. 1A, and FIG. 1C is a cross-section view along plane C-C of FIG. 1A.

An N-type doped layer 3 is arranged on a P-type doped silicon substrate 1. Substrate 1 and layer 3 form the photoconversion area of the sensor. The upper portion of the photoconversion area is divided into a plurality of lines 5 separated by insulation rows 7, for example formed of trenches filled with oxide. Columns of insulated electrodes 9, for example, made of polysilicon, equidistant, and perpendicular to lines 5 are arranged above layer 3. A thin oxide layer 11 deposited at the surface of layer 3 insulates electrodes 9 from layer 3. Electrodes 9, properly biased, define in each line 5 a succession of potential wells where electric charges can be stored. In the shown example, a pixel is defined in each line by four successive electrodes G1 to G4. The potential well corresponding to such a pixel is created by application of a high voltage, for example, on the order of 5 V, to electrodes G2 and G3, and of a low voltage, lower than the high voltage, for example, on the order of 0 V, to electrodes G1 and G4.

During an image acquisition period, the sensor is illuminated and electrons resulting from the creation, by absorption of a photon, of an electron-hole pair in the photoconversion area are stored in the potential wells which fill up proportionally to the illumination of the corresponding pixel. The illumination light needs to cross electrodes 9 and insulation layer 11. The thickness of the active region of the sensor, essentially formed by substrate 1 and layer 3, is sufficient to absorb the photons, whatever their wavelengths in the wanted spectrum.

After the acquisition period, a transfer period is provided during which the charges stored in the potential wells are transferred in the direction indicated by arrows 13, in parallel for the plurality of columns and in series for the pixels of a same line 5, to read and/or storage circuits. The charge shifting is ensured by successive modifications of the voltages applied to the electrodes.

FIG. 2 schematically illustrates a simple four-phase mode of transfer of the charges from one well to an adjacent well by switching, between high and low states, of voltages Φ1, Φ2, Φ3, Φ4 applied to electrodes G1, G2, G3, G4 of each pixel.

At a time t0 corresponding to the end of an image acquisition period, charges, shown by the hatched areas of the drawings, are stored in the potential wells formed by application of a high voltage on electrodes G2 and G3 and of a low voltage on electrodes G1 and G4.

At a time t0+T, T being the period of the clock driving the charge transfer, the voltages applied to electrodes G2 and G4 are switched. Thus, the shifting of the potential wells causes the synchronized shifting of the charge packets to the right. To ease the transfer, electrode G4 will be set to the high voltage before electrode G2 is set to the low voltage.

At a time t0+2T, the voltages applied to electrodes G1 to G3 are switched. At a time t0+3T, the voltages applied to electrodes G2 and G4 are switched. Finally, at a time t0+4T, the voltages applied to electrodes G1 and G3 are switched.

Thus, at the fourth clock period after time t0, the charges stored in a potential well under a pixel have been shifted towards a potential well under an adjacent pixel of the same line. At the sensor output, the shifted charge packets may be converted into electric voltages by adapted circuits, to form an image signal.

Of course, the transfer period is short as compared with the acquisition period. As an example, the acquisition period is on the order of from 20 to 50 ms and the electrode switching clock frequency may be greater than 2 MHz, which provides a transfer time shorter than 2 ms for a line of 1,000 pixels and a shifting in four phases.

To decrease the transfer period and to simplify the electrode switching circuits, two-phase charge-coupled devices have been provided.

FIG. 3 schematically shows a portion of an example of a two-phase charge-coupled device. FIG. 3 is a cross-section view along the same plane as FIG. 1B, previously described. The structure of the sensor of FIG. 3 resembles that of the four-phase image sensor described in relation with FIGS. 1A to 1C. In the two-phase sensor, as in the four-phase sensor, a pixel is defined, in each line, by four successive electrodes G1 to G4. Layer 3 is divided into alternating columns of two different doping levels, under electrodes 9. In the shown example, the columns of layer 3 under electrodes G1 and G3 have a doping of a first level N1 and the columns of layer 3 under electrodes G2 and G4 have a doping of a second level N2 greater than N1. Electrodes G1 and G2 on the one hand and G3 and G4 on the other hand are interconnected, for example, by metallization levels, not shown.

FIG. 4 schematically illustrates the storage, during an image acquisition period, of electrons photogenerated in potential wells formed by application of voltages Φ1, Φ2 to electrodes G1, G2, G3, G4 of each pixel. FIG. 4 further illustrates a simple two-phase mode of electron transfer, from one well to an adjacent well, by switching between high and low states of voltages Φ1 and Φ2.

At a time t0 corresponding to the end of an image acquisition period, charges shown by the hatched areas of the drawing are stored in potential wells formed by application of a low voltage, for example, on the order of 0 V, on electrodes G1 and G2 and of a high voltage, for example, on the order of 5 V, on electrodes G3 and G4. When two adjacent electrodes are set to a same voltage, the photogenerated electrons are stored in the corresponding N-layer portion of highest doping level (level N2 of FIG. 3). Further, when two adjacent electrodes are set to respectively high and low voltages, the electrons are stored in the N layer region under the high-voltage electrode. Thus, at time t0, charge packets corresponding to points of the acquired image are stored in the N layer, mainly under electrodes G4 of each pixel.

At a time t0+T, T being the period of the clock driving the charge transfer, voltages Φ1 and Φ2 applied to electrodes G1, G2 and G3, G4 are switched to increase the electrostatic potential under electrodes G1 and G2 and to decrease the electrostatic potential under electrodes G3 and G4. This results in a displacement of the potential wells, which causes the synchronized shifting of the charge packets to the right. Thus, at the second clock period after time t0, the charges stored in a potential well under a pixel have been shifted towards a potential well under an adjacent pixel of the same line.

As an example, for an electrode switching clock frequency greater than 2 MHz, the transfer time is shorter than 1 ms for a line of 1,000 pixels and a shifting in two phases.

A disadvantage of two-phase CCDs of the type described in relation with FIG. 3 is that they are more difficult to form than four-phase sensors such as described in relation with FIGS. 1A to 1C. Indeed, the adjacent columns of the two-phase sensor differ by their doping level. For the manufacturing of such a sensor, two successive electrode-forming sequences needs to be provided. In a first sequence, a first alternation of electrodes G1, G3 (FIG. 3) is formed, at the surface of a uniformly-doped N layer at a first level N1. An implantation step is then carried out to obtain, in the regions of the N layer unmasked by first electrodes G1 and G3, a doping level N2 greater than N1. Then, in a second sequence, a second alternation of electrodes G2, G4, interposed between first electrodes G1 and G3, is formed.

FIG. 5 schematically shows another example of a two-phase charge-coupled device. FIG. 5 is a cross-section view along the same plane as FIG. 3. The structure of this sensor resembles that of the two-phase sensor described in relation with FIG. 3. Only the differences between the two sensors will be discussed hereafter. In the sensor of FIG. 5, the doping level of layer 3 is uniform. However, the thickness of gate oxide layer 11 ranging between the electrode columns and layer 3 is not uniform. The gate oxide under electrodes G1 and G3 is thicker than the gate oxide under electrodes G2 and G4. When two adjacent electrodes are set to a same voltage, the photogenerated electrons are stored in the N layer portion under the electrode having the thickest gate oxide. Further, when two adjacent electrodes are set to respectively high and low voltages, the electrons are stored in the portion of layer 3 under the high voltage electrode. The operation of this sensor is thus identical to that of the sensor described in relation with FIGS. 1A to 10.

As for the sensor described in relation with FIG. 3, the gate structure needs to be formed in two steps, which makes the manufacturing process more complicated than that of four-phase sensors.

Thus, a disadvantage of four-phase sensors is that the switching mode of the voltages applied to the electrodes is complex with respect to that of two-phase sensors. A disadvantage of two-phase sensors is that they are more difficult to manufacture than four-phase sensors.

A general disadvantage of the above-described CCD sensors is that the light needs to cross the polysilicon transfer control electrodes. Part of the photons are thus absorbed in the electrodes, which decreases the sensitivity of the sensor, especially in the blue range. Indeed, blue photons are absorbed over a short distance while red photons penetrate deeper into the silicon. To overcome this disadvantage, the transfer electrodes may be arranged next to the photoconversion region rather than above it. However, this solution has the disadvantage of increasing the bulk for a given size of the photoconversion region.

Another general disadvantage of the above-described CCD sensors lies in the fact that the charge storage capacity associated with each pixel is limited by the electrode surface area and by possible carrier recombinations.

SUMMARY OF THE INVENTION

An object of an embodiment of the present invention is to overcome all or part of the disadvantages of conventional two-phase charge-coupled devices.

An object of an embodiment of the present invention is to provide a two-phase CCD structure which is easy to form.

An object of an embodiment of the present invention is to provide such a sensor with an improved sensitivity and a low bulk.

An object of an embodiment of the present invention is to provide such a sensor with a large charge storage capacity.

Thus, an embodiment of the present invention provides a charge transfer device formed in a semiconductor substrate and comprising an array of identical electrodes forming rows and columns, wherein: each electrode extends in a cavity with insulated walls formed of a groove, oriented along a row, dug into the substrate thickness, and comprising, at one of its ends, a protrusion extending towards at least one adjacent row.

Another embodiment of the present invention provides an image sensor comprising a charge transfer device such as mentioned hereabove, capable of receiving a visible radiation.

According to an embodiment of the present invention, the electrodes of a same column are interconnected and are capable of receiving shifting signals in two phases.

According to an embodiment of the present invention, each electrode is formed in a T-shaped groove.

According to an embodiment of the present invention, an image element corresponds to the interval between two successive electrodes of a row and two successive opposite electrodes of an adjacent row.

According to an embodiment of the present invention, the upper portion of the substrate comprises a first doped semiconductor layer of a first conductivity type of a first doping level, and a second doped semiconductor layer of a second conductivity type, covering the first layer.

According to an embodiment of the present invention, the first layer is connected to a terminal of application of a reference voltage.

According to an embodiment of the present invention, a third doped semiconductor layer of the first conductivity type covers the second layer.

According to an embodiment of the present invention, the electrodes are made of doped polysilicon insulated from the substrate by an oxide layer.

According to an embodiment of the present invention, an end of each line is connected to a read device capable of converting the charges into an image electric signal.

The foregoing objects, features, and advantages of the present invention will be discussed in detail in the following non-limiting description of specific embodiments in connection with the accompanying drawings.

DETAILED DESCRIPTION

As usual in the representation of integrated circuits, the various drawings are not to scale.

In the sensor described herein, the charge transfer electrodes are arranged vertically, across the depth of the substrate photoconversion area.

Figure 6A:
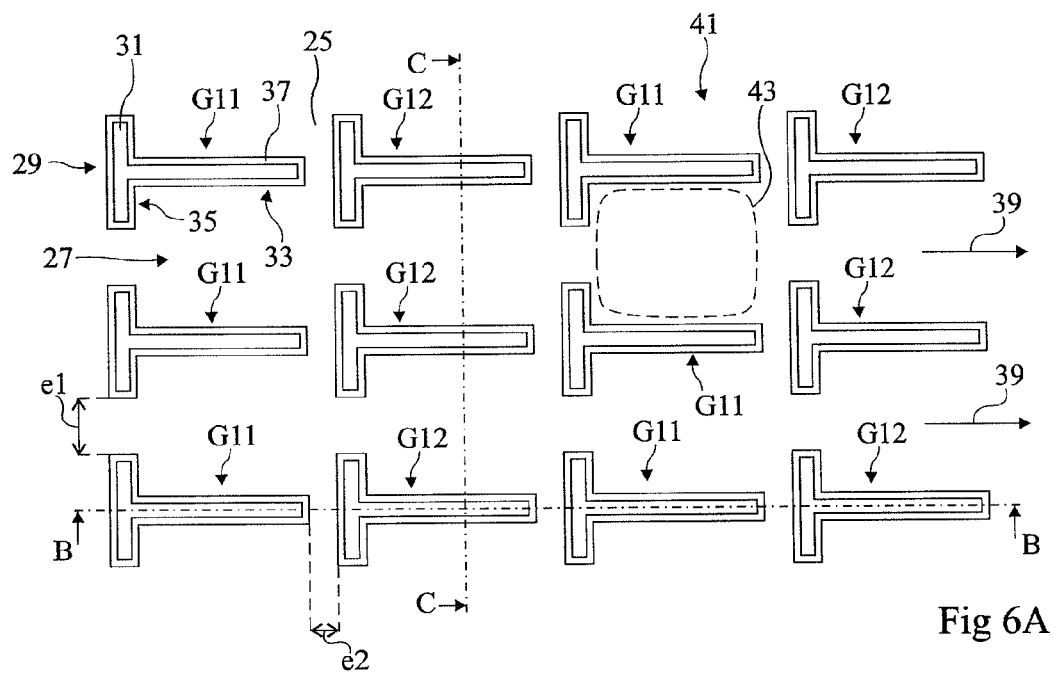
FIG. 6A is a top view schematically showing a portion of a two-phase CCD according to an embodiment of the present invention.
Figure 6B:
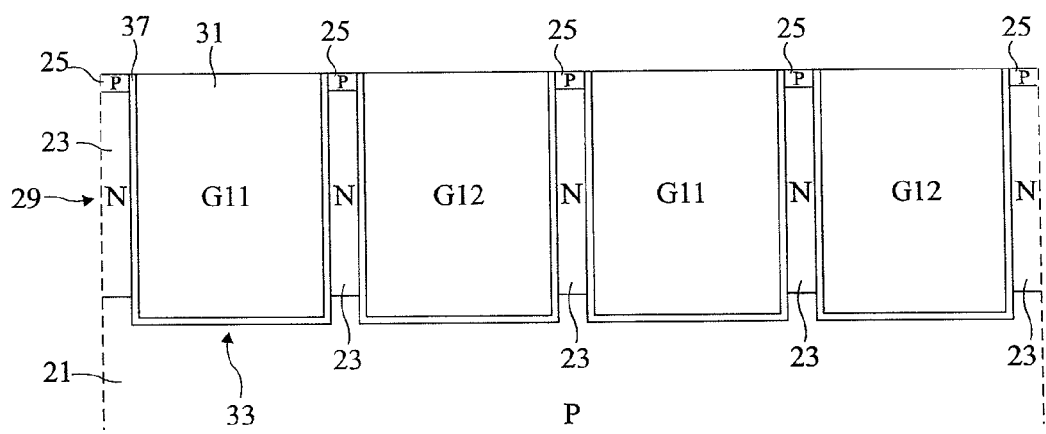
FIG. 6B is a cross-section view along plane B-B of FIG. 6A.
Figure 6C:
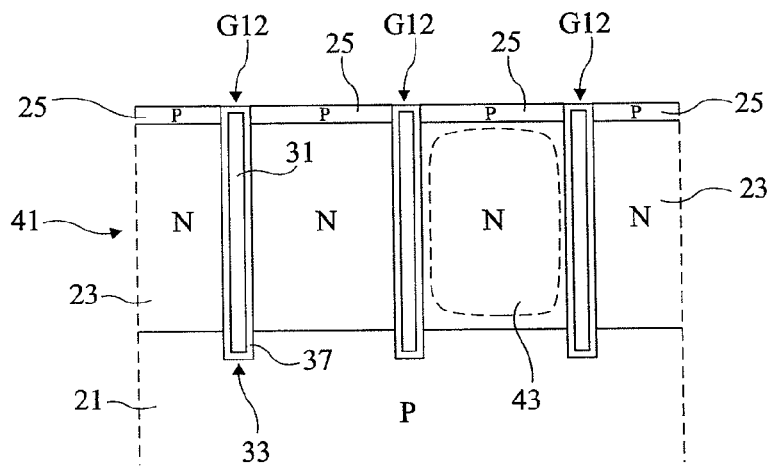
FIG. 6C is a cross-section view along plane C-C of FIG. 6A.

FIGS. 6A to 6C schematically show a portion of a two-phase charge-coupled device. FIG. 6A is a top view, FIG. 6B is a cross-section view along plane B-B of FIG. 6A, and FIG. 6C is a cross-section view along plane C-C of FIG. 6A.

Figure 7:
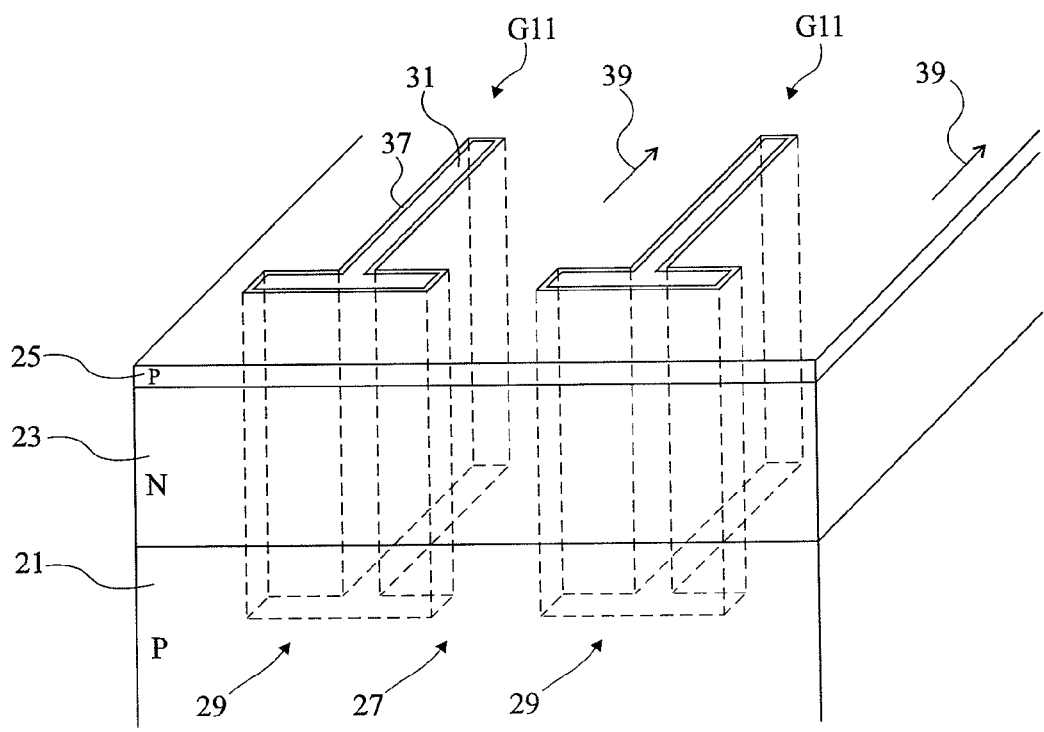
FIG. 7 is a partial perspective view of the sensor of FIGS. 6A to 6C.

FIG. 7 is a perspective view schematically showing a portion of FIGS. 6A to 6C.

An N-type doped layer 23 is arranged on a P-type doped silicon substrate 21. Layer 23 and possibly the upper portion of substrate 21 form the sensor photoconversion area. A thin P-type doped layer 25 is formed at the surface of layer 23. Layer 25 especially has the function of avoiding the presence of an interface between the upper surface of layer 23 and an upper silicon layer (not shown). Indeed, the presence of an interface between layer 23 containing charge carriers and a silicon oxide layer would result in a decrease in the number of carriers by trapping at the interface or in a dark current increase. Another function of layer 25 is to maintain a reference voltage in layer 23.

The photoconversion area is divided into a plurality of parallel lines 27, separated by rows 29 of insulated electrodes 31 extending vertically, for example, through layers 25, 23, and 21. Each electrode 31 is formed of a Tshaped groove comprising a stem 33 and a bar 35, filled with doped polysilicon, insulated from the substrate by an oxide layer 37. Stems 33 are aligned and oriented in a direction parallel to the charge transfer direction. Orthogonal bars are arranged upstream of stems 33 with respect to charge transfer direction 39.

The electrodes 31 of two adjacent rows 29 are opposite two by two and form electrode columns 41.

Electrodes 31, properly biased, define in each line 27 a succession of potential wells in which electric charges may be stored. In the shown example, a pixel is defined by the region between two successive electrodes G11, G12 of a first row 29, and the two corresponding electrodes G11, G12 of a second row 29 adjacent to the first row. In practice, in this example, all the electrodes of a same column 41 are interconnected and are set to a same voltage.

The electrodes need to be arranged properly to avoid possible charge leakages from one pixel line to an adjacent line. It will preferably for example be chosen to arrange the electrodes so that the shortest distance e1 between two adjacent electrodes of a same column is greater than the shortest distance e2 between two adjacent electrodes of a same line.

During an image acquisition period, the upper surface of the sensor is illuminated and electrons, originating from the creation, by absorption of a photon, of an electron-hole pair in the photoconversion area, are stored in the potential wells which fill proportionally to the illumination of the corresponding pixel. Substrate 21 is connected, in operation, to a reference voltage, for example, the ground, enabling the flowing of the holes resulting from the photoconversion.

The depth of electrodes 31 is preferably selected to limit video crosstalk phenomena, that is, this depth is preferably equal to the depth of the area in which the incident photons are as a majority capable of creating electron-hole pairs (for example, 9 µm for red).

The electrodes are biased in such a way that the photogenerated electrons are stored in N-type layer 23, in a volume 43 schematically delimited by dotted lines in FIGS. 6A and 6C. It should be noted that there is no direct interface between electron storage volume 3 and oxide layer 37 for insulating electrodes 31, and no direct interface with an upper oxide layer, which avoids charge losses or a dark current increase.

To obtain a maximum charge storage capacity between electrodes, the thickness of layer 23 is preferably close to the depth of electrodes 31. Thus, the photoconversion area is essentially formed by N-type layer 23.

After the acquisition period, a transfer period is provided, during which the charges stored in the potential wells are transferred, in the direction of arrows 39, in parallel for the plurality of columns and in series for the pixels of a same line 27, towards read and/or storage circuits. The charge shifting is ensured by successive switchings in two phases, between high and low states of the voltages applied to the electrodes.

In the CCD sensor described in relation with FIGS. 6A to 6C and 7, each electrode is formed in a T-shaped groove. Generally, each electrode is formed in a groove oriented along a row and exhibiting, on the side of a first one of its ends, a protrusion of any shape towards at least one adjacent row. The protrusion is arranged upstream of the send end of the groove with respect to the charge transfer direction.

Figure 8:
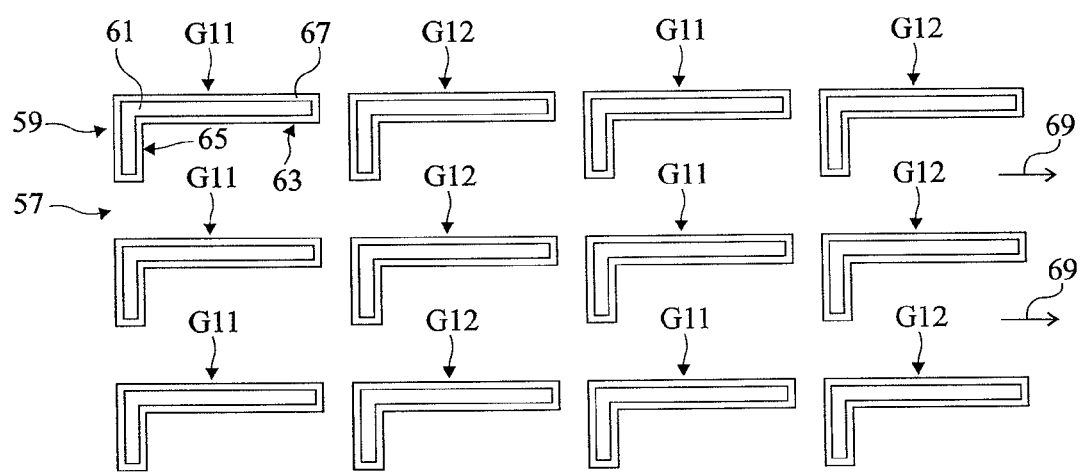
FIG. 8 is a top view schematically showing a portion of a two-phase CCD according to another embodiment of the present invention.

FIG. 8 is a top view schematically showing another embodiment of a two-phase CCD. The photoconversion area is divided into a plurality of parallel lines 57, separated by rows 59 of insulated electrodes 51 extending vertically across the substrate. Each electrode 61 is formed of an L-shaped groove comprising a large bar 63 and a small bar 65, filled with doped polysilicon, insulated from the substrate by an oxide layer 67. Large bars 63 are aligned and oriented in a direction parallel to the charge transfer direction. Small orthogonal bars 65 are arranged upstream of large bars 63 with respect to charge transfer direction 69. The electrodes 61 of two adjacent rows 59 are opposite two by two and form electrode columns.

Figure 1A:
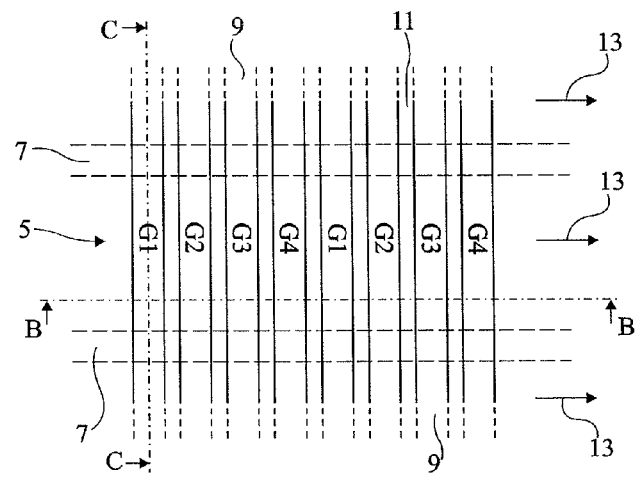
FIG. 1A, previously described, is a top view schematically showing a portion of a four-phase CCD sensor.
Figure 1B:
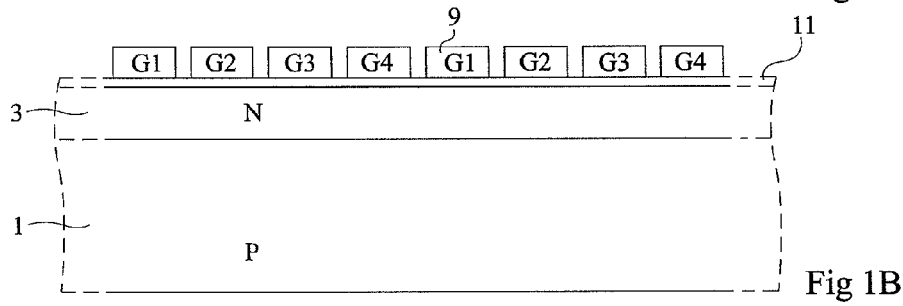
FIG. 1B, previously described, is a cross-section view along plane B-B of FIG. 1A.
Figure 1C:
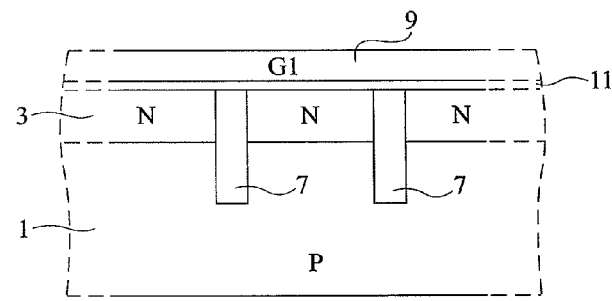
FIG. 1C, previously described, is a cross-section view along plane C-C of FIG. 1A.
Figure 2:
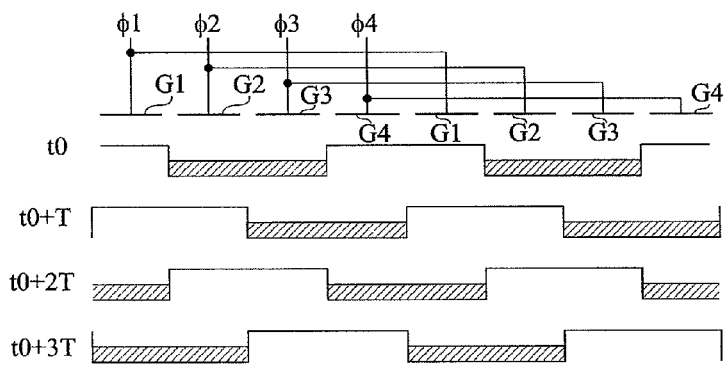
FIG. 2, previously described, illustrates the charge transfer in a four-phase CCD sensor.
Figure 3:
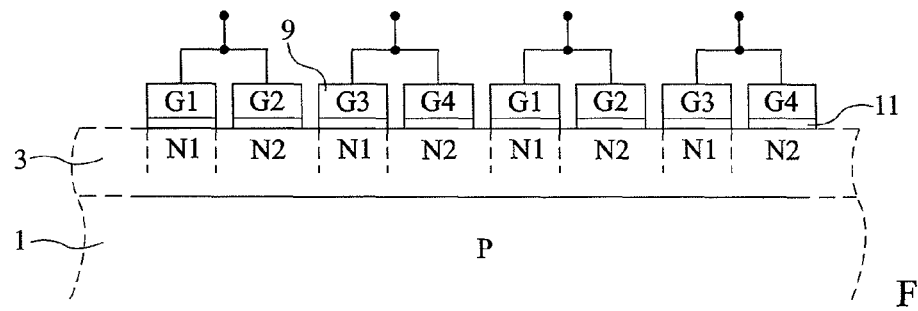
FIG. 3, previously described, is a cross-section view schematically showing a portion of a two-phase CCD.
Figure 4:
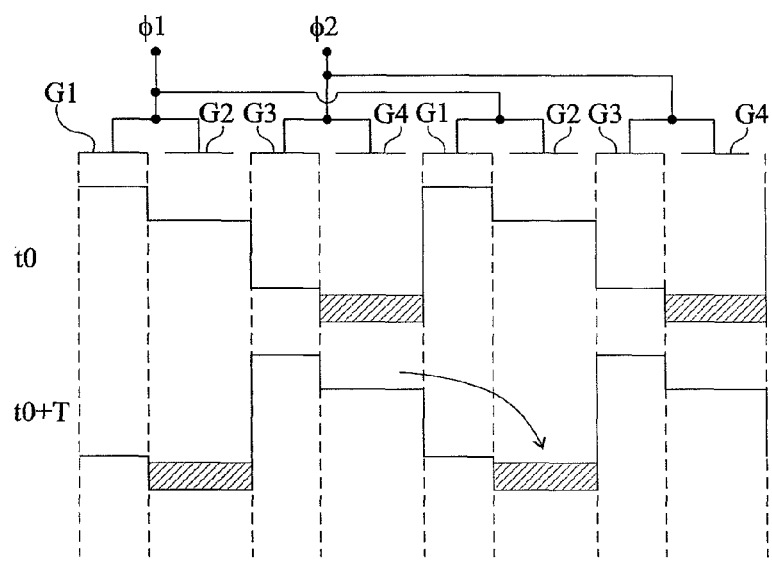
FIG. 4, previously described, illustrates the charge transfer in a two-phase CCD.
Figure 5:
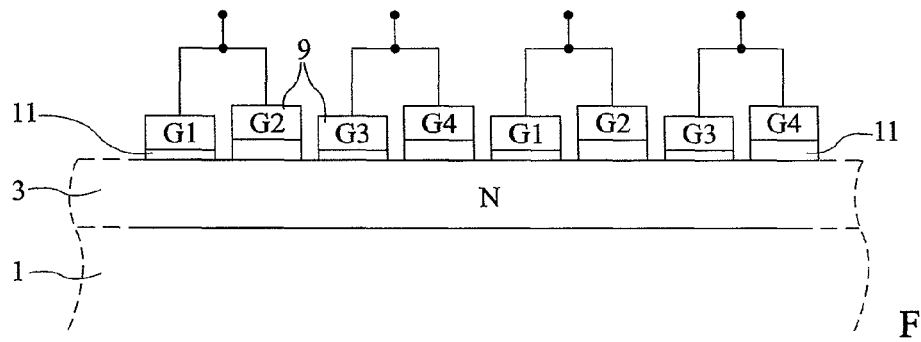
FIG. 5, previously described, is a cross-section view schematically showing a portion of another type of two-phase CCD.
Figure 9:
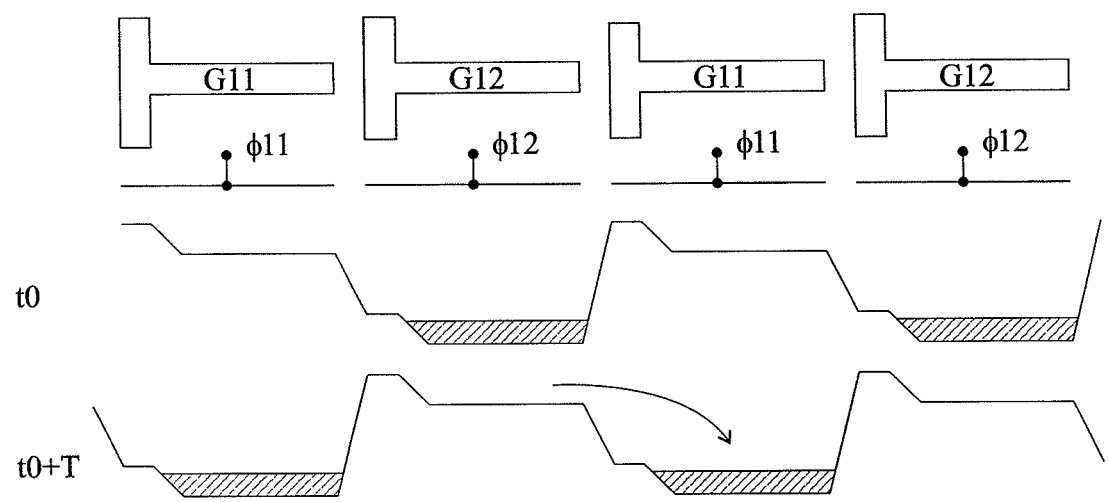
FIG. 9 schematically illustrates the charge transfer in the two-phase CCD described in relation with FIGS. 6A to 6C and 7.

FIG. 9 schematically illustrates the storage, in an image acquisition period, of electrons photogenerated in potential wells formed by application of voltages $\Phi 11$, $\Phi 12$ to electrodes G11, G12 of each pixel of the CCD sensor described in relation with FIGS. 6A to 6C and 7. FIG. 9 further illustrates a simple two-phase electron transfer mode, from one well to an adjacent well, by switching between high and low states of voltages Φ11 and Φ12. This operation is similar to that described in relation with FIG. 4.

At a time t0 corresponding to the end of an image acquisition period, charges, shown by the hatched areas of the drawing, are stored in potential wells formed by application of a low voltage, for example, on the order of 0 V, on electrodes G11 and of a high voltage, for example, 5 V, on electrodes G12. When two opposite electrodes G11 are set to a same voltage, the photogenerated electrons are mainly stored in the region of the N layer between the electrode portions exhibiting no protrusion (volume 43 of FIGS. 6A and 6C). Further, when two pairs of adjacent opposite electrodes are set to respectively high and low voltages, electrons are stored in the region of the N layer delimited by the pair of high-voltage electrons. Thus, at time t0, charge packets corresponding to points of the acquired image are stored in the N layer, mainly between electrode portions G12 of each pixel exhibiting no protrusion.

Any other electrode biasing mode during the acquisition phase may be envisaged. As an example, a same positive, negative, or zero voltage may be applied to electrodes G11 and G12 during the acquisition phase to decrease dark currents. In this case, the charges are stored in two separate potential wells, before being gathered in the same well (volume 43 of FIGS. 6A and 6C) at the time of the transfer.

At a time t0+T, T being the period of the clock for driving the charge transfer, voltages Φ11 and Φ12 applied to electrodes G11 and G12 are switched. The shifting of the potential wells causes the synchronized shifting of the charge packets to the right in the shown example. Thus, at the second clock period after time t0, the charges stored in a potential well under a pixel have been shifted to a potential well under an adjacent pixel of the same line.

An advantage of the described CCD sensor is that it is simple to form. As an example, an N-type doped semiconductor layer is formed by epitaxy on a P-type doped substrate. The upper portion of the N-type layer is P-type doped. Narrow trenches are formed by etching in the substrate. These trenches are insulated from the substrate by an oxide layer, then filled with doped polysilicon forming the electrodes. A contact is taken on each electrode.

Another advantage of the described CCD sensor is that the light for illuminating the sensor does not cross the charge transfer control electrodes. The sensitivity of the sensor is thus improved and its bulk does not increase with respect to prior art solutions.

According to another advantage of the described CCD sensor, the charge storage capacity associated with a pixel is greater than that of prior art solutions for a same pixel surface. Indeed, in the provided embodiment, the dopant concentration and the volume of the N layer of the potential wells are greater than when the electrodes are arranged at the sensor surface. Further, the storage capacity may be adjusted by increasing or decreasing the distance between two electrode lines.

According to another advantage of the described CCD sensor, the voltages implemented for the charge transfer may be decreased with respect to prior art solutions since two adjacent electrodes of a same column cooperate to create the potential wells.

Specific embodiments of the present invention have been described. Various alterations and modifications will occur to those skilled in the art. In particular, an embodiment of a front-side illuminated CCD sensor has been discussed hereabove. It will be within the abilities of those skilled in the art to implement the desired operation for a back-side illuminated CCD sensor. Further, it will be within the abilities of those skilled in the art to implement the desired operation by inverting the conductivity types of the semiconductor layers and by accordingly modifying the applied voltages. Doped polysilicon electrodes and silicon oxide insulating regions have further been mentioned in the above description. It will be within the abilities of those skilled in the art to implement the desired operation whatever the type of conductive material used to form the electrodes and whatever the insulating material used to form the insulating regions. Electrode arrays forming rows and columns of identical electrodes have further been described hereabove. It will be within the abilities of those skilled in the art to provide, for the upper and lower sensor rows, any adapted electrode shape, different from that of the other electrodes, for example, L-shaped electrodes for a T-shaped electrode array.

Embodiments of two-phase charge-coupled devices have been described hereabove. However, the present invention does not only apply to image sensors. It will also be within the abilities of those skilled in the art to form a two-phase charge transfer shift register according to an above-discussed embodiment, where the charges are not photogenerated, but injected, for example, upstream of the transfer lines.

As an example, a CCD image sensor comprising a four-phase charge transfer photosensitive array and, at the output of this array, a two-phase shift register according to one of the above-discussed embodiments may be formed, the two-phase register being for example used as a register with parallel inputs and a serial output.

Between two successive transfers of a column of the photosensitive array towards the shift register, the shift register is emptied, in series, towards a storage device, for example, a memory. The clock frequencies of the photosensitive array and of the shift register are selected so that the time taken to empty the shift register in series is shorter than or equal to the duration of the charge transfer in the photosensitive array, from one column to an adjacent column. The clock frequency of the shift register thus needs to be much larger than the clock frequency of the photosensitive array. An advantage of the use of a two-phase shift register is that for a given drive frequency, its emptying time is decreased by a factor two with respect to a four-phase register.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A two-phase charge transfer device, comprising:
    a semiconductor substrate;
    an array of grooves with insulated walls formed in the substrate, the grooves of the array being arranged in rows and columns extending transversely to each other, the grooves of each column being spaced apart from the grooves of adjacent columns, and the grooves of each row being spaced apart from the grooves of adjacent rows, each groove having, at a first end of the groove, a protrusion extending toward at least one adjacent row of the rows; and
    an array of electrodes respectively extending in the grooves, wherein each electrode within a groove of a row of the rows is electrically insulated from adjacent electrodes within the other grooves of the row.

2. The charge transfer device of claim 1, wherein the columns include:

first alternate columns, the electrodes in the first alternate columns being electrically coupled to each other and configured to be biased together; and second alternate columns alternating with the first alternate columns, the electrodes in the first alternate columns being electrically coupled to each other configured to be biased together so as to transfer charge in the array according to a two-phase biasing process.

3. The charge transfer device of claim 1, wherein each groove is a T-shaped groove.

4. The charge transfer device of claim 1, wherein the substrate includes an upper portion that includes a first doped semiconductor layer of a first conductivity type of a first doping level, and a second doped semiconductor layer of a second conductivity type, covering the first doped semiconductor layer.

5. The charge transfer device of claim 4, wherein the first doped semiconductor layer is connected to a terminal of application of a reference voltage.

6. The charge transfer device of claim 4, wherein the substrate includes a third doped semiconductor layer of the first conductivity type that covers the second doped semiconductor layer.

7. An image sensor comprising a charge transfer device configured to receive visible radiation, the charge transfer device including:
a semiconductor substrate;
an array of grooves with insulated walls formed in the substrate, the grooves of the array being arranged in rows and columns extending transversely to each other, the grooves of each column being spaced apart from the grooves of adjacent columns and the grooves of each row being spaced apart from the grooves of adjacent rows, each groove having, at a first end of the groove, a protrusion extending toward at least one adjacent row of the rows; and
an array of electrodes respectively extending in the grooves, wherein each, electrode within a groove of a row of the rows is electrically insulated from adjacent electrodes within the other grooves of the row.

8. The sensor of claim 7, wherein the electrodes of a same column are interconnected and are configured to receive charge-shifting signals in two phases.

9. The sensor of claim 7, wherein each groove is a T-shaped groove.

10. The sensor of claim 7, wherein an image element comprises two successive electrodes in each of two adjacent rows.

11. The sensor of claim 7, wherein the substrate includes an upper portion that includes a first doped semiconductor layer of a first conductivity type of a first doping level, and a second doped semiconductor layer of a second conductivity type, covering the first doped semiconductor layer.

12. The sensor of claim 11, wherein the first doped semiconductor layer is connected to a terminal of application of a reference voltage.

13. The sensor of claim 11, wherein a third doped semiconductor layer of the first conductivity type covers the second doped semiconductor layer.

14. The sensor of claim 7, wherein the electrodes are made of doped polysilicon insulated from the substrate by an oxide layer.

15. The sensor of claim 7, wherein an end of each row is connected to a read device capable of converting the charges into an image electric signal.

16. The sensor of claim 7, wherein the columns include:
first alternate columns, the electrodes in the first alternate columns being electrically coupled to each other and configured to be biased together; and
second alternate columns alternating with the first alternate columns, the electrodes in the first alternate columns being electrically coupled to each other configured to be biased together so as to transfer charge in the array according to a two-phase biasing process.

17. The sensor of claim 7, wherein a first shortest distance between adjacent electrodes in each column is greater than a second shortest distance between adjacent electrodes in each row.

* * * * *